United States Patent [19]

Domenichini et al.

[11] Patent Number: 4,651,086

[45] Date of Patent: Mar. 17, 1987

[54] APPARATUS AND METHOD FOR DETERMINING THE RESISTANCE OF A COIL CONNECTION OF AN ELECTRIC MOTOR WINDING

[75] Inventors: Carlo Domenichini, Poggibonsi; Gaetano Gastaldin, Verona, both of Italy

[73] Assignee: Axis S.p.A., Italy

[21] Appl. No.: 720,539

[22] Filed: Apr. 8, 1985

[30] Foreign Application Priority Data

May 24, 1984 [IT] Italy ................. 21084 A/84

[51] Int. Cl.[4] .............. G01R 27/14; G01R 27/02
[52] U.S. Cl. ............................... 324/64; 324/62; 324/158 MG
[58] Field of Search ............... 322/99; 361/31; 318/490; 340/648; 324/158 MG, 62, 64, 52

[56] References Cited

U.S. PATENT DOCUMENTS 3,927,368 12/1975 Zielonko ................. 324/62
4,178,543 12/1979 Wrinn ..................... 324/64
4,400,663 8/1983 May ....................... 324/52

FOREIGN PATENT DOCUMENTS 0752580 8/1980 U.S.S.R. ............... 324/158 MG

Primary Examiner—Reinhard J. Eisenzopf
Assistant Examiner—Jose M. Solis
Attorney, Agent, or Firm—Lerner, David, Littenberg, Krumholz & Mentlik

[57] ABSTRACT

A method, and apparatus, for determining the resistance of the electrical connections between coils and the bars of a commutator for electric motors as well as the resistance of the coils themselves includes applying appropriate voltages to the commutator bars to simulate a cut in the winding thus permitting determination of the connection resistance independently of the coil resistance. After the connection resistance has been determined, the measurement of an additional voltage permits the determination of the coil resistance.

29 Claims, 3 Drawing Figures

APPARATUS AND METHOD FOR DETERMINING THE RESISTANCE OF A COIL CONNECTION OF AN ELECTRIC MOTOR WINDING

BACKGROUND OF THE INVENTION

The present invention is related generally to electrical test equipment and more specifically to electrical test equipment used for testing electric motors.

The need to make test measurements on electric motors in order to insure the absence of winding anomalies and defective connections to the terminals is well known. A typical case where these tests are needed is represented by the wound armatures of commutator type motors.

One of the difficulties encountered during these tests is the difference in values between the coil resistance itself and the resistance of the connections between the coils and the commutator bars. Therefore, the straightforward measurement of the resistance between two commutator bars to which the tangs of one coil are connected is not satisfactory. In fact, a defective connection between the coil and the commutator bar does not necessarily lead to a measured resistance that is so high as to be distinctly outside the tolerance limits for such a measurement. Thus, when making measurements between two commutator bars an eventual fault due to a faulty winding or a bad connection between the coil and the commutator bar may not be recognized.

SUMMARY OF THE PRESENT INVENTION

The present invention is directed to a method and apparatus for determining the coil resistance and the resistance of the coil connections independently of the coil resistance. These resistances provide information about the correctness of the winding, its continuity, and whether the electrical connections of the coils are defective. All measurements are made through electrical connections applied to the commutator bars which are all easily accessible.

The method and apparatus of the present invention for determining the resistance of coil connections of an electric motor winding which includes a plurality of coils connected in series includes generating a first current through one of the coil connections and an associated coil. The current flowing through a portion of the winding adjacent to the associated coil is eliminated. A first voltage is measured across the one coil connection and a coil connection associated with the adjacent portion of the winding. The resistance of the coil connection is determined from the first voltage and the generated first current whereby the resistance is determined independently of the resistance of the associated coil.

According to one aspect of the present invention the generation of the first current is accomplished by applying a second voltage across the one coil connection and a second coil connection associated with the associated coil.

According to another aspect of the present invention the elimination of the current flowing through a portion of the winding adjacent to the associated coil includes applying a third voltage across the second coil connection and a third coil connection adjacent to the second coil connection such that a second current is generated through the second and third coil connections and the coil arranged therebetween. A fourth voltage is measured across fourth and fifth coil connections associated with the adjacent portion of the winding. The third voltage is adjusted such that the fourth voltage is kept to a value of zero.

According to another aspect of the invention circuitry is provided for moving the winding relative to the apparatus such that a plurality of connection resistances can be determined.

According to a further aspect of the invention a fifth voltage across the second coil connection and a coil connection associated with the adjacent portion of the winding is measured and the resistance of the associated coil is determined from the fifth voltage, the determined resistance of the second coil connection, and the first and second generated currents.

According to a still further aspect of the invention the resistance of each of the coils is determined. The determined coil and connection resistances can be stored and displayed according to the needs of the user.

A clear understanding of the present invention as well as the advantages and benefits flowing therefrom will become apparent from the description of a preferred embodiment hereinbelow.

DESCRIPTION OF A PREFERRED EMBODIMENT

Figure 1:
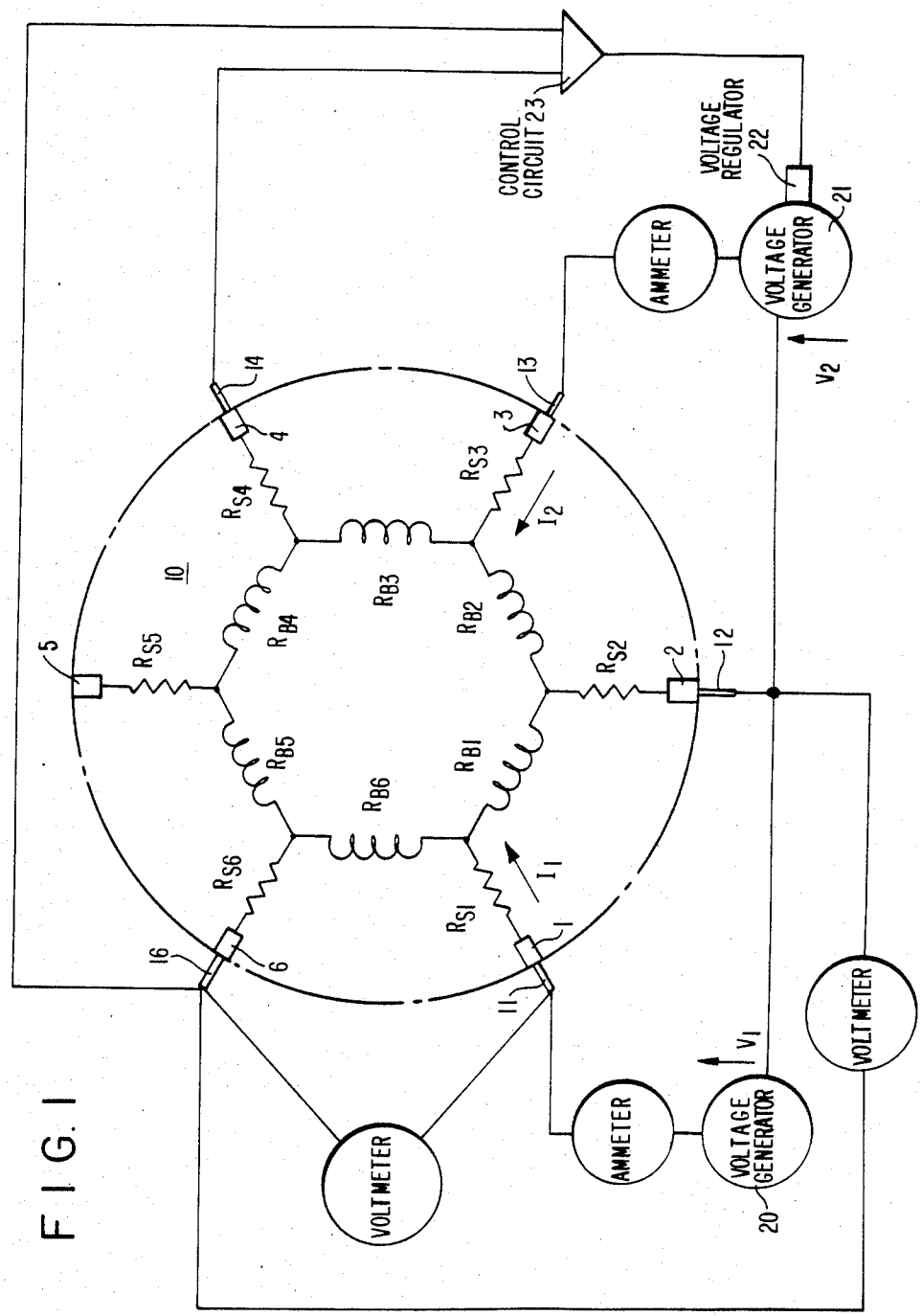
FIG. 1 represents a wiring diagram of the present invention shown connected to an armature of an electric motor.

For clarity of explanation, the apparatus and method of the present invention is described in conjunction with an armature winding 10 comprised of six coils $R_{B1}$, $R_{B2}$, $R_{B3}$, $R_{B4}$, $R_{B5}$, and $R_{B6}$ connected to six commutator bars 1, 2, 3, 4, 5, and 6 as illustrated in FIG. 1. The present invention, however, can be used to test the armature of an electric motor having any number of coils and armature bars greater than five. The following description is provided merely for purposes of illustration and not limitation.

The armature winding 10 illustrated in FIG. 1 is made up of the series connection of the six coils $R_{B1}$ through $R_{B6}$. The juncture between each of the coils is connected to a commutator bar such that each coil is connected to a commutator bar at opposite ends thereof. Thus, coil $R_{B1}$ is connected at opposite ends to commutator bars 1 and 2, coil $R_{B2}$ is connected at opposite ends to commutator bars 2 and 3, coil $R_{B3}$ is connected at opposite ends to commutator bars 3 and 4, coil $R_{B4}$ is connected at opposite ends to commutator bars 4 and 5, coil $R_{B5}$ is connected at opposite ends to commutator bars 5 and 6, and coil $R_{B6}$ is connected at opposite ends to commutator bars 6 and 1.

The connection between each of the windings and its respective commutator bars exhibits a resistance which is to be measured by the apparatus and method of the present invention. This resistance is indicated schematically in FIG. 1 as $R_{S1}$, $R_{S2}$, $R_{S3}$, $R_{S4}$, $R_{S5}$, and $R_{S6}$ representative of the resistance of the connection between the commutator bars 1 through 6, respectively, and the coils of the armature.

Contact elements 11, 12, 13, 14, and 16, which can be simple feelers, are brought into electrical contact with commutator bars 1, 2, 3, 4 and 6, respectively. A first voltage generator 20 is disposed between contact elements 11 and 12 to provide a voltage across commutator bars 1 and 2. A second voltage generator 21 is disposed between contact elements 12 and 13 to supply a voltage across commutator bars 2 and 3. The second voltage generator 21 is provided with a voltage regulator shown schematically as block 22.

Two contact elements, 14 and 16, feed a control circuit 23 which produce and sends a signal responsive to the voltage across commutator bars 4 and 6 to voltage regulator 22 for purposes fully described hereinafter.

Assuming the application of voltage $V_1$ across contact elements 11 and 12 and a substantially equal voltage $V_2$ across contact elements 13 and 12, the asymmetry of the workpiece and the diversity of the voltage generators will cause a difference between the currents $I_1$ and $I_2$ flowing between the respective contact elements. For purposes of illustration we will assume $I_1$ to be greater than $I_2$ and therefore predominant over the latter.

$I_1$ consists of two parts, the larger of which returns to voltage generator 20 through the loop $R_{S1}$, $R_{B1}$ and $R_{S2}$. However, a small portion of the current $I_1$ travels through the loop $R_{S1}$, $R_{B6}$, $R_{B5}$, $R_{B4}$, $R_{B3}$, $R_{B2}$, and $R_{S2}$. Similarly, $I_2$ consists of two parts, the greater of which returns to voltage generator 21 through $R_{S3}$, $R_{B2}$, and $R_{S2}$. A small portion of the current of $I_2$ travels through the loop consisting of $R_{S3}$, $R_{B3}$, $R_{B4}$, $R_{B5}$, $R_{B6}$, $R_{B1}$, and $R_{S2}$. Because we have assumed $I_1$ to be greater than $I_2$, the currents flowing through the winding coils $R_{B6}$, $R_{B5}$, $R_{B4}$, and $R_{B3}$ do not cancel each other out. Under those conditions, a voltage can be measured across commutator bars 4 and 6.

The voltage measured across commutator bars 4 and 6 is input to the control circuit 23 which produces an output signal for driving the voltage regulator 22. This control signal causes the voltage generator 21 to vary the voltage $V_2$ so that the total current circulating through coils $R_{B6}$, $R_{B5}$, $R_{B4}$, and $R_{B3}$ is kept to a value of zero.

With the current flowing through the coils $R_{B6}$, $R_{B5}$, $R_{B4}$, and $R_{B3}$ reduced to zero, it is easy to establish an equation for determining the value of the resistance $R_{S1}$:

$$R_{S1} = V_{1-6}/I_1$$

The voltage across commutator bars 1 and 6 can be easily measured as can the current $I_1$. Measuring those two values, and solving the equation provides the value for the resistance $R_{S1}$.

After the value for the resistance $R_{S1}$ has been determined, the commutator may be rotated clockwise one step with reference to the contact elements so that the commutator bar 2 is now in contact with contact element 11. By repeating the measurements previously described, the value of the resistance $R_{S2}$ can be easily calculated. In a similar fashion, the value of the resistances $R_{S3}$, $R_{S4}$, $R_{S5}$, and $R_{S6}$ can be determined by successive measurements made after rotation of the commutator by one step.

Once the value of $R_{S2}$ has been obtained, the value of the coil resistance $R_{B1}$ can be calculated from the following equation:

$$V_{6-2} = R_{B1} * I_1 + R_{S2} * (I_1 + I_2)$$

The voltage across commutator bars 6 and 2 is measured, as are the currents $I_1$ and $I_2$. The value of the resistance $R_{S2}$ has been previously calculated and therefore the value of the resistance $R_{B1}$ can be easily determined. In a similar fashion, the values for the resistance of each of the coils $R_{B2}$, $R_{B3}$, $R_{B4}$, $R_{B5}$, and $R_{B6}$ can each be calculated.

In summary, for each position of the armature winding 10 it is sufficient to measure two voltages, $V_{6-2}$ and $V_{1-6}$, and two currents $I_1$ and $I_2$, which are all readily available. From these measurements, all of the resistances within the armature can be calculated.

It is clearly possible to use the present invention in connection with motors having any number of bars and any number of coils. Additionally, the measurements described above can be carried out with a very simple apparatus, which is a definite advantage.

Figure 2:
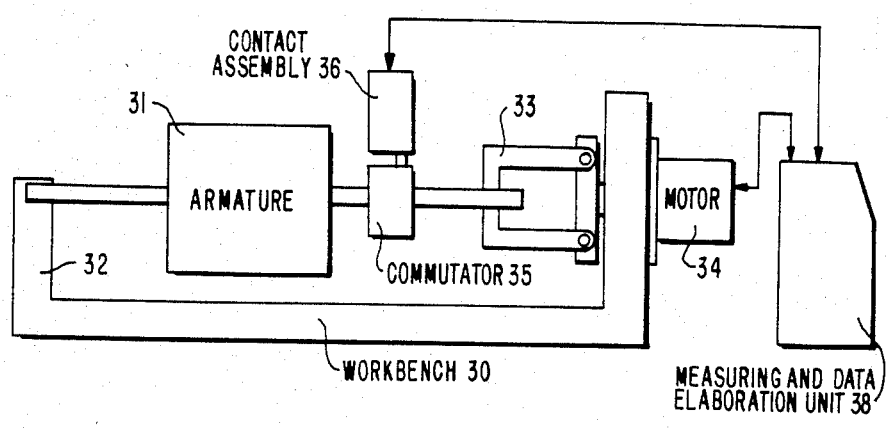
FIG. 2 is a general view of the apparatus of the present invention.

FIG. 2 illustrates a diagrammatic side view of the apparatus of the present invention. It includes a workbench 30 on which the armature 31 is held freely by holder 32 at one end, and at its other end by a collet 33 which rotates in response to a motor 34. A contact element assembly 36 is provided with the contact elements arranged in a fan-like manner so that each contact element contacts one of the commutator bars of the commutator 35.

Figure 3:
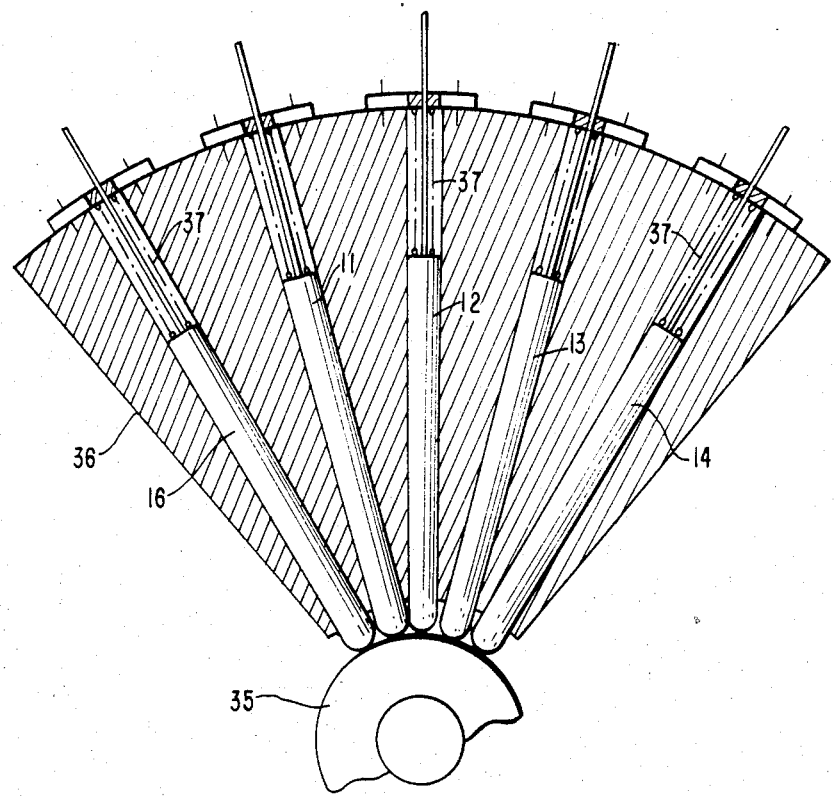
FIG. 3 illustrates the contact elements of the present invention in contact with the commutator of an electric motor.

The contact element assembly 36 may be of the type illustrated in FIG. 3 wherein the contact elements 11, 12, 13, 14, and 16 are formed by rods running inside secondary seats and pushed by springs 37. The construction details of these items are not shown because they are well within the skill of a trained technician and may be provided by a variety of structures and forms. Particularly, means may be provided to retract the contact elements while the rotor is taken out of the test station to avoid damaging the contact elements. Further, two contact elements may be aligned to act on the same commutator bar in situations where voltage must be applied to the bar and at the same time a measurement taken. In the present example, this is the case of the three central contact elements of the five contact element fan corresponding to the positions of commutator bars 1, 2, and 3 in FIG. 1.

Returning to FIG. 2, the apparatus may include sensors (not shown) for determining the angular position of the motor 34 to control its step by step rotation to bring successive commutator bars in correspondence with the contact elements.

A measuring and data elaboration unit 38 is provided. The data elaboration unit 38 is connected with the contact elements 11–14 and 16 and may also include the voltage generators 20 and 21, voltage regulator 22 and control circuit 23 shown schematically in FIG. 1. The data elaboration unit 38 is capable of performing the various calculations from the measured voltages and currents as discussed above and is also capable of storing, filing, and displaying the data concerning the resistance values $R_{S1}$, $R_{S2}$ ... $R_{Sn}$ and $R_{B1}$, $R_{B2}$ ... $R_{Bn}$, according to the purpose of the present invention and the needs of the user.

The preceeding explanation of the principles of the present invention and how they can be put into practice permit an expert in this field to carry out countless variations of the proposed method of measurement and of the relevant apparatus, all of which are functionally equivalent and within the scope of the present invention. For example, it is evident that for the purpose of the invention, in order to measure the resistance $R_{S1}$ as well as $R_{B1}$, contact elements 11, 12, and 13 must be placed in such a way as to contact consecutive bars of the commutator. The voltage measurement between contact elements 16 and 14, to drive the voltage regulator of one of the generators, could be carried out on any commutator bar except those in contact with contact elements 11, 12, and 13. For other eventual measurements which may be useful for rotor tests, the skilled artisan can vary the position of the contact elements to realize the circuit and the measuring apparatus to perform such tests.

What is claimed is:

1. A method for determining the resistance of coil connections of an electric motor winding which includes a plurality of coils connected in series, comprising the steps of:
    (a) generating a first current through one of said coil connections and an associated coil;
    (b) eliminating the current flowing through a portion of said winding adjacent to said associated coil by introducing a cancelling current, oppositely directed to said first current, through said portion of said winding adjacent to said associated coil;
    (c) measuring a first voltage across said one coil connection and a coil connection associated with said adjacent portion of said winding; and
    (d) determining the resistance of said one coil connection from said first voltage and said generated first current, whereby said resistance is determined independently of the resistance of said associated coil.

2. The method of claim 1 wherein the step of generating said first current includes the step of applying a second voltage across said one coil connection and a second coil connection associated with said associated coil.

3. A method for determining the resistance of coil connections of an electric motor winding which includes a plurality of coils connected in series, comprising the steps of:
    (a) generating a first current through one of said coil connections and an associated coil;
    (b) eliminating the current flowing through a portion of said winding adjacent to said associated coil;
    (c) measuring a first voltage across said one coil connection and a coil connection associated with said adjacent portion of said winding; and
    (d) determining the resistance of said one coil connection from said first voltage and said generated first current, whereby said resistance is determined independently of the resistance of said associated coil,
    wherein the step of generating said first current includes the step of applying a second voltage across said one coil connection and a second coil connection associated with said associated coil, and
    wherein the step of eliminating the current includes the steps of applying a third voltage across said second coil connection and a third coil connection adjacent to said second coil connection such that a second current is generated through said second and third coil connections and the coil arranged therebetween, measuring a fourth voltage across fourth and fifth coil connections associated with said adjacent portion of said winding, and adjusting said third voltage such that said fourth voltage is zero.

4. The method of claim 3, wherein steps (a)–(d) are sequentially repeated for the other coil connections of said winding, whereby the resistance of each coil connection can be determined.

5. The method of claim 4 additionally comprising the steps of (e) measuring a fifth voltage across said second coil connection and a coil connection associated with said adjacent portion of said winding, and (f) determining the resistance of said associated coil from said fifth voltage, said determined resistance of said second coil connection, and said first and second generated currents.

6. The method of claim 5, wherein steps (e)–(f) are sequentially repeated for the other coils of said winding, whereby the resistance of each coil is determined.

7. The method of claim 6, wherein said winding includes at least five coil connections.

8. The method of claim 7, wherein said coil connections are between said coils and commutator bars of an electric motor armature.

9. The method of claim 1 wherein the eliminating step includes automatically eliminating the current flowing through said portion of said winding.

10. The method of claim 1 additionally comprising the step of displaying said determined resistance.

11. The method of claim 1 additionally comprising the step of storing said determined resistance.

12. An apparatus for determining the resistance of coil connections of an electric motor winding which includes a plurality of coils connected in series, comprising:
    means for generating a first current through one of said coil connections and an associated coil;
    means for eliminating the current flowing through a portion of said winding adjacent to said associated coil by introducing a cancelling current, oppositely directed to said first current, through said portion of said winding adjacent to said associated coil;
    means for measuring a first voltage across said one coil connection and a coil connection associated with said adjacent portion of said winding; and
    means for determining the resistance of said one connection from said first voltage and said generated first current, whereby said resistance is determined independently of the resistance of said associated coil.

13. The apparatus of claim 12 wherein the means for generating said first current includes means for applying a second voltage across said one coil connection and a second coil connection associated with said associated coil.

14. An apparatus for determining the resistance of coil connections of an electric motor winding which includes a plurality of coils connected in series, comprising:
    means for generating a first current through one of said coil connections and an associated coil;
    means for eliminating the current flowing through a portion of said winding adjacent to said associated coil;
    means for measuring a first voltage across said one coil connection and a coil connection associated with said adjacent portion of said winding; and
    means for determining the resistance of said one connection from said first voltage and said generated first current, whereby said resistance is determined independently of the resistance of said associated coil,
    wherein the means for generating said first current includes means for applying a second voltage across said one coil connection and a second coil connection associated with said associated coil, and wherein the means for eliminating the current includes means for applying a third voltage across said second coil connection and a third coil connection adjacent to said second coil connection such that a second current is generated through said second and third coil connections and the coil arranged therebetween, means for measuring a fourth voltage across fourth and fifth coil connections associated with said adjacent portion of said winding, and means for adjusting said third voltage such that said fourth voltage is zero.

15. The apparatus of claim 14, additionally comprising means for moving said winding relative to said apparatus such that said determining means determines a plurality of connection resistance.

16. The apparatus of claim 15 additionally comprising means for measuring a fifth voltage across said second coil connection and a coil connection associated with said adjacent portion of said winding, and wherein said determining means determines the resistance of said associated coil from said fifth voltage, said determined resistance of said second coil connection, and said first and second generated currents.

17. The apparatus of claim 16, wherein said means for moving moves said winding relative to said apparatus such that said determining means determines a plurality of coil resistances.

18. The apparatus of claim 17, wherein said winding includes at least five coil connections.

19. The apparatus of claim 18, wherein said coil connections are between said coils and commutator bars of an electric motor armature.

20. The apparatus of claim 12 wherein said means for eliminating includes means for automatically eliminating the current flowing through said portion of said winding.

21. The apparatus of claim 12 additionally comprising means for displaying said determined resistance.

22. The apparatus of claim 12 additionally comprising means for storing said determined resistance.

23. An apparatus for determining the resistance of a connection of a coil to a commutator bar of an electric motor winding which includes at least five coils connected in series, comprising:
means for applying a first voltage across first and second commutator bars and for applying a second voltage across said second and a third commutator bar;
means for measuring a third voltage across fourth and fifth commutator bars;
means for adjusting said second voltage such that said third voltage is zero;
means for measuring a fourth voltage across said first and one of said fourth and fifth commutator bars; and
means for determining the resistance of said first connection from said fourth voltage, whereby said resistance is determined independently of the resistance of said coil.

24. The apparatus of claim 23 additionally comprising means for measuring a fifth voltage across said second and one of said fourth and fifth commutator bars, and wherein said determining means determines the resistance of said coil from said fifth voltage.

25. The apparatus of claim 24 additionally comprising means for storing said determined resistances and means for displaying said determined resistances.

26. The method of claim 1 wherein the step of eliminating the current by introducing a cancelling current comprises applying a second voltage across a portion of said winding.

27. The apparatus of claim 12 wherein the means for eliminating the current by introducing a cancelling current comprises means for applying a second voltage across a portion of said winding.

28. A method for determining the resistance of coil connections of an electric motor winding which includes a plurality of coils connected in series, comprising the steps of:
(a) generating a first current through one of said coil connections and an associated coil;
(b) eliminating the current flowing through a portion of said winding adjacent to said associated coil while maintaining said plurality of coils in a serially connected state;
(c) measuring a first voltage across said one coil connection and a coil connection associated with said adjacent portion of said winding; and
(d) determining the resistance of said one coil connection from said first voltage and said generated first current, whereby said resistance is determined independently of the resistance of said associated coil.

29. An apparatus for determining the resistance of coil connections of an electric motor winding which includes a plurality of coils connected in series, comprising:
means for generating a first current through one of said coil connections and an associated coil;
means for eliminating the current flowing through a portion of said winding adjacent to said associated coil while maintaining said plurality of coils in a serially connected state;
means for measuring a first voltage across said one coil connection and a coil connection associated with said adjacent portion of said winding; and
means for determining the resistance of said one connection from said first voltage and said generated first current, whereby said resistance is determined independently of the resistance of said associated coil.

* * * * *